(12) United States Patent
Wicpalek et al.

(10) Patent No.: US 8,598,929 B1
(45) Date of Patent: Dec. 3, 2013

(54) BITWIDTH REDUCTION IN LOOP FILTERS USED FOR DIGITAL PLLS

(71) Applicants: Christian Wicpalek, Puchenau (AT); Thomas Mayer, Linz (AT)

(72) Inventors: Christian Wicpalek, Puchenau (AT); Thomas Mayer, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/664,536

(22) Filed: Oct. 31, 2012

(51) Int. Cl.
*H03L 7/06* (2006.01)

(52) U.S. Cl.
USPC ............................................ 327/158; 327/147

(58) Field of Classification Search
USPC ............................................................ 327/147
See application file for complete search history.

(56) References Cited

U.S. PATENT DOCUMENTS

| | | | | |
|---|---|---|---|---|
| 8,193,842 | B2 * | 6/2012 | Min et al. | 327/156 |
| 8,248,127 | B2 * | 8/2012 | Chan et al. | 327/172 |
| 2011/0204944 | A1 * | 8/2011 | Lee et al. | 327/159 |
| 2012/0032718 | A1 * | 2/2012 | Chan et al. | 327/156 |
| 2012/0105116 | A1 * | 5/2012 | Min et al. | 327/156 |
| 2012/0161834 | A1 * | 6/2012 | Lee et al. | 327/156 |
| 2013/0002317 | A1 * | 1/2013 | Frantzeskakis et al. | 327/156 |
| 2013/0169457 | A1 * | 7/2013 | Helio et al. | 341/120 |

OTHER PUBLICATIONS

Staszewski, et al.; "LMS-Based Calibration of an RF Digitally Controlled Oscillator for Mobile Phones"; IEEE Transactions on Circuits and Systems-II: Express Briefs, vol. 53, No. 3, Mar. 2006, p. 225-229.

* cited by examiner

*Primary Examiner* — Adam Houston
(74) *Attorney, Agent, or Firm* — Eschweiler & Associates, LLC

(57) ABSTRACT

The disclosed invention relates to a digital phase locked loop having a switchable digital loop filter configured to selectively operate at different levels of resolution. The digital phase locked loop has a phase frequency detector that determines a phase difference between a reference signal and a feedback signal and to convert the phase difference to a digital word. A digital loop filter filters the digital word to generate a control word. A bit shift network modifies the digital word in a manner that switches the resolution of the digital loop filter between two or more distinct resolution states that comprise a bit sequence located at different positions in the digital word. The two or more distinct resolution states allow the digital loop filter to provide a low resolution (high amplitude) for a settling state of operation and a high resolution (low amplitude) for a locked state of operation.

20 Claims, 6 Drawing Sheets

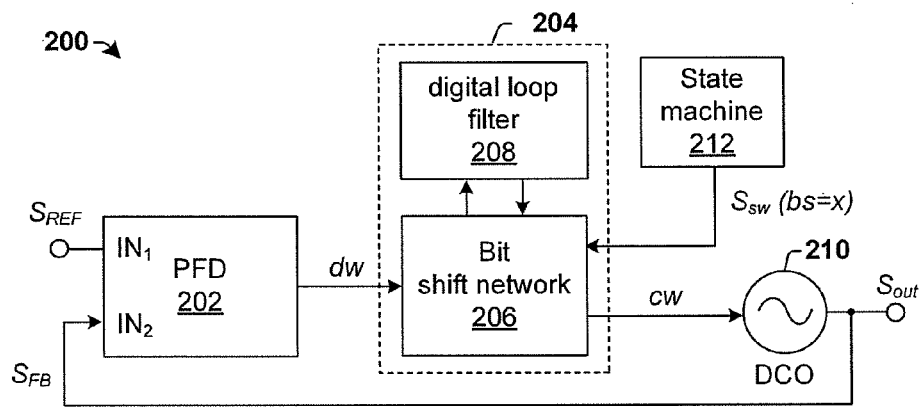
Fig. 2
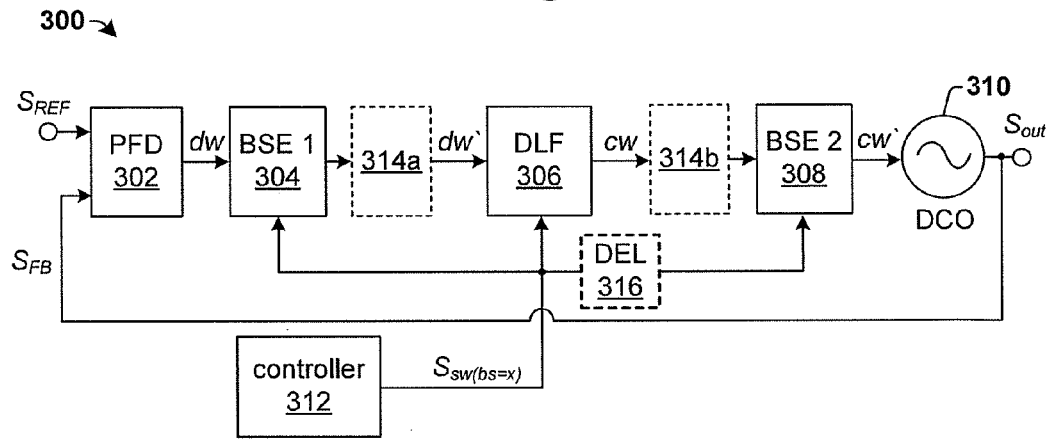
Fig. 3A
| signal | Digital word value | Decimal number |
|---|---|---|
| dw | 0b111110100 | 500d |
| dw` (bs=4) | 0b11111 | 31d |
| cw | 0b11001 | 25d |
| cw` (bs=4) | 0b110010000 | 400d |
Fig. 3B

318 ⇘

| signal | Digital word value | Decimal number |
|---|---|---|
| dw | 0b11111 | 31d |
| dw` (bs=4) | 0b111110000 | 496d |
| cw | 0b110010000 | 400d |
| cw` (bs=4) | 0b11001 | 25d |

(12) United States Patent

BITWIDTH REDUCTION IN LOOP FILTERS USED FOR DIGITAL PLLS

BACKGROUND

A phase locked loop (PLL) is a circuit that locks the phase of an output signal to the phase of a reference signal. A PLL operates as a feedback system that feeds the output signal back to a phase detector, which detects a phase error in the output signal and then drives an oscillator to adjust the phase of the output signal in response to the detected phase error.

PLLs are configured to operate in two states, an unlocked or settling state and a locked or settled state. In the unlocked state, the phase detector generates a control signal that changes the frequency of the oscillator so that the phase of the output signal converges upon the phase of the reference signal. In the locked state, the phase detector generates a control signal that keeps the phases of the reference signal and the output signal together.

BRIEF DESCRIPTION OF THE DRAWINGS

FIG. 2 illustrates a block diagram of a disclosed digital phase locked loop.

FIG. 3A illustrates a block diagram of a disclosed digital phase locked loop.

FIGS. 3B-3C are tables showing operation of the digital phase locked loop of FIG. 3A during settling and locked states.

FIG. 4 illustrates a graph showing the effect of resolution changes on a digital word input to a digital loop filter.

DETAILED DESCRIPTION

Figure 1A:
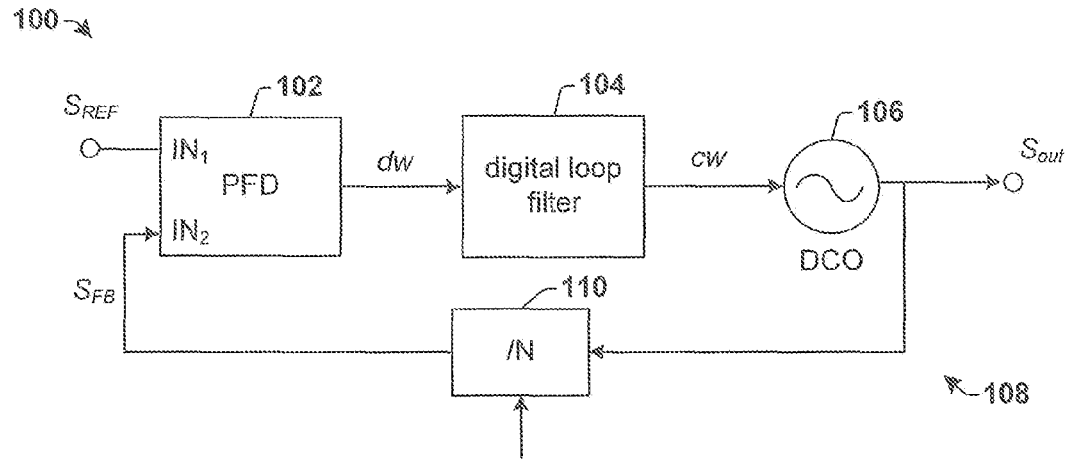
FIG. 1A illustrates a conventional phase locked loop.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

FIG. 1A illustrates a digital phase locked loop (DPLL) 100. DPLL 100 comprises a phase frequency detector (PFD) 102 having a first input node $IN_1$ configured to receive a reference signal $S_{REF}$ and a second input node $IN_2$ configured to receive a feedback signal $S_{FB}$ (i.e., a divided DCO signal) from a divider circuit 110. The PFD 102 is configured to determine a phase difference between edges of the reference signal $S_{REF}$ and the feedback signal $S_{FB}$ and to convert the phase difference to a digital word dw proportional to the phase difference. The digital word dw is provided to a digital loop filter 104, which filters and integrates the digital word dw to generate a control word cw. The control word cw is used to control a digitally controlled oscillator 106 to vary the phase of the output signal $S_{out}$, so as to align edges of the feedback signal $S_{FB}$ with edges of the reference signal $S_{REF}$.

Figure 1B:
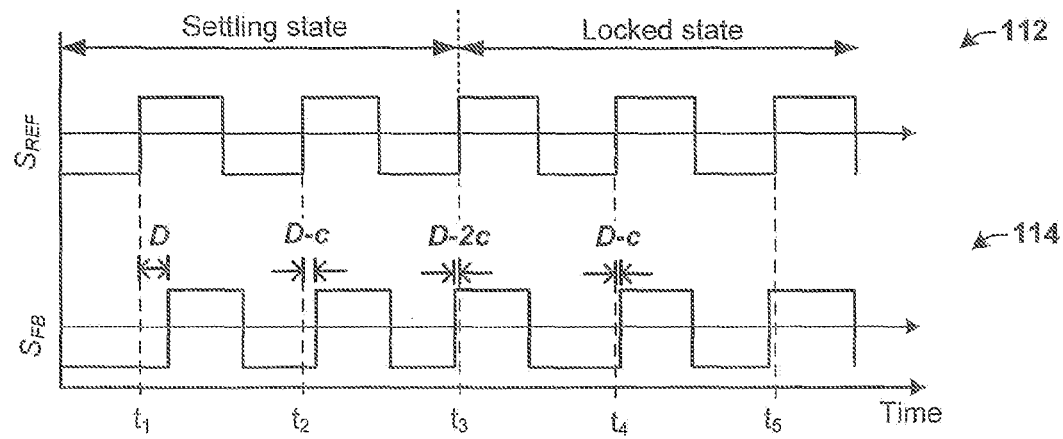
FIG. 1B illustrates timing diagrams showing operation of the conventional phase locked loop.

FIG. 1B illustrates timing diagrams 112-114 showing operation of PLL 100 in a settling state and in a locked state. At a first time $t_1$, the reference signal 112 is leading the feedback signal 114 by a value of D, causing PFD 102 to generate a digital word that causes DCO 106 to increase its frequency of operation and move the edge of the feedback signal 114 forward by a value of c. At a second time $t_2$, the reference signal 112 is still leading the feedback signal 114 by a value of D-c, causing PFD 102 to generate a digital word that causes DCO 106 to increase its frequency of operation and move the edge of the feedback signal 114 forward by a value of c. At a third time $t_3$, the PLL 100 enters the locked state, in which the phase of the feedback signal 114 leads the phase of the reference signal 112 by D-2c<0, causing the PFD 102 to generate a digital word that causes DCO 106 to decrease its frequency of operation and move the edge of the feedback signal 114 backwards by a value of c. At subsequent times $t_4$-$t_5$, the DCO 106 is operated to maintain a feedback signal 114 having a phase that is substantially equal to that of the reference signal 112.

When DPLL 100 is operated properly, the digital loop filter 104 provides a large amplitude bandwidth while maintaining a high frequency resolution. The large amplitude bandwidth provides for good tracking of the reference signal $S_{REF}$, which increases the settling speed of the DPLL 100 to track a reference signal $S_{REF}$. The high frequency resolution reduces deviations from the reference signal $S_{REF}$ once in a locked state. However, to maintain both a high frequency resolution and large amplitude the digital word must contain a large number of bits. To process the large number of bits, the DPLL 100 must have a large gate count that results in a large current consumption and increased die area.

Accordingly, the present disclosure relates to a digital phase locked loop having a switchable digital loop filter configured to selectively vary the resolution of a digital loop filter to operate in different resolution states. The digital phase locked loop (DPLL) comprises a phase frequency detector configured to determine a phase difference between a reference signal and a feedback signal and to convert the phase difference to a digital word. A digital loop filter is configured to filter the digital word to generate a control word. A bit shift network is configured to modify the digital word in a manner that switches the resolution of the digital loop filter between two or more distinct resolution states that comprise a sequence of bits located at different positions within the digital word. By modifying the digital word to vary the resolution of the digital loop filter, a digital word can reuse the bit sequence to provide for both a high resolution and a high amplitude.

FIG. 2 illustrates a block diagram of a disclosed digital phase locked loop (DPLL) 200.

The DPLL 200 comprises a phase frequency detector (PFD) 202 configured to receive a reference signal $S_{REF}$ and a feedback signal $S_{FB}$. The PFD 202 is configured to determine a phase difference between the reference signal $S_{REF}$ and the feedback signal $S_{FB}$ and to output a digital word dw corresponding to the detected phase difference. In some cases, PFD 202 may comprise a time-to-digital converter (TDC) configured to detect the phase difference. The digital word dw is provided to a switchable filtering element 204 configured to filter the digital word dw according to a two or more distinct filtering resolution states to generate a control word cw that drives operation of a digitally controlled oscillator 210.

In some cases, the switchable filtering element 204 comprises a bit shift network 206 that is configured to shift the position of bits within the digital word dw (i.e., to change the location of a sequence of bits in the digital word) in a manner that switches operation of a digital loop filter 208 between two or more distinct filtering resolution states (e.g., between a first filtering resolution state and a second filtering resolution state). By shifting the position of bits within the digital word dw, the bit shift network 206 causes bit slots of a digital word dw to be used for both a high resolution state (i.e., having bits shifted to a first configuration) with a low amplitude bandwidth and a low resolution state (i.e., having bits shifted to a second configuration) with a high amplitude bandwidth. The first and second filtering resolution states have resolutions that are inversely proportional to their amplitude bandwidths. For example, the first filtering resolution state may comprise a high resolution and a low amplitude bandwidth, while the second filtering resolution state may comprise a low resolution and a high amplitude bandwidth.

A state machine 212 is configured to control operation of the bit shift network 206 to vary the resolution state of the digital loop filter 208. In some cases. The state machine may vary the resolution state depending on an operating state of DPLL 200. For example, when the DPLL 200 is operating in a settling state, the bit shift network 206 may operate the digital loop filter 208 at a high amplitude with a coarse resolution (e.g., wherein each bit of digital word corresponds to a frequency value of x+n). When the DPLL 200 is operating in a locked (i.e., settled) state, the bit shift network 206 may operate the digital loop filter 208 at a low amplitude with a fine resolution (e.g., wherein each bit of digital word corresponds to a frequency value of x<x+n).

By operating the bit shift network 206 to change operation of the digital loop filter 208, the resolution of the digital loop filter 208 is able to switch between a low resolution (that provides for fast locking during the locking state) and a high resolution (that fulfills the spectral requirements during the locked state), while reducing the number of bits that the digital loop filter 208 uses to achieve both resolutions in comparison to a conventional DPLL. The reduction of bits in the digital word results in a current and die area saving.

FIG. 3A illustrates a block diagram of a disclosed digital phase locked loop (DPLL) 300.

The DPLL 300 comprises a phase frequency detector (PFD) 302 configured to receive a reference signal $S_{REF}$ and a feedback signal $S_{FB}$ and to output a digital word dw corresponding to a phase difference between the reference signal $S_{REF}$ and the feedback signal $S_{FB}$. The digital word dw is provided to a first bit shifting element 304. Depending upon a switching signal $S_{sw}$ received from controller 312, the first bit shifting element 304 is configured to selectively shift the position of bits within the digital word dw in a first direction, by a bit shift value x, to generate a shifted digital word dw' that is filtered by a digital loop filter 306. By shifting the position of bits within the digital word dw, the resolution of the digital loop filter 306 is adjusted (e.g., increased or decreased depending on the direction of the shift). For example, shifting a digital word dw having bit values of "0101010" to the right by a bit shift value of x=1 generates a shifted digital word dw' of "0010101", thereby changing the decimal equivalent of the digital word from 42 to 21 and reducing the resolution of the digital loop filter 306.

The digital loop filter 306 is configured to filter the shifted digital word dm' to generate a control word cw. The control word cw is provided to a second bit shifting element 308. Depending upon a switching signal $S_{sw}$ received from controller 312, the second bit shifting element 308 is configured to selectively shift the position of bits within the control word cw in a second direction, by a bit shift value x, to generate a shifted control word cw' that is provided to a digitally controlled oscillator (DCO).

In some cases, a first length modification element 314a is configured to truncate or elongate the shifted digital word dw' to reduce or increase the number of bits in the digital word by a number of bits that is equal to the bit shift value x. For example, if the digital word dw is shifted to the left by 4 bit slots, the length modification element 314a may remove the 4 most significant bits from the shifted digital word dw'. Alternatively, if the digital word dw is shifted to the right by 4 bit slots, the length modification element 314a may remove the 4 least significant bits from the shifted digital word dw'. In some cases, a second length modification element 314b is configured to undo the truncation or elongation of the first bit shifting element 304 by elongating or truncating the control word to increase or reduce the number of bits in the control word by a number of bits that is equal to the bit shift value x.

In some cases, as illustrated in FIG. 3A, a first length modification element 314a configured to truncate the digital word dw is connected between the first bit shifting element 304 and the digital loop filter 306, while a second length modification element 314b configured to elongate the control word cw is connected between the digital loop filter 306 and the second bit shifting element 308. In other cases, a first length modification element 314a configured to elongate the digital word dw is connected between PFD 302 and the first bit shifting element 304, while a second length modification element 314a configured to truncate the control word cw is connected between the second bit shifting element 308 and the DCO 310.

In some cases, DPLL 300 further comprises a delay element 316 connected between the controller 312 and the second bit shifting element 308. The delay element 316 is configured to introduce a delay into the switching signal $S_{sw}$ that accounts for delays introduced by the digital loop filter 306.

In some cases the digital loop filter 306 comprises a high resolution that is optimized for DPLL 300 operating in a locked state. In such a case, the first bit shifting element 304 is configured to selectively decrease the resolution of the digital loop filter 306 when operating in the settling state. Therefore, during the locked state, the first bit shifting element 304 is inactive and does not operate upon the digital word dw. However, during the settling state, the first bit shifting element 304 is activated to operate upon the digital word dw to decrease the resolution of the digital loop filter 306.

For example, FIG. 3B is a table 318 showing operation of DPLL 300 having a digital loop filter 306 with a high resolution. As shown in table 318, during the settling mode the first bit shifting element 304 receives a first digital word dw="111110100". The first bit shifting element 304 is operated to shift bit values in the digital word dw to the right by x=4 places to generate a shifted digital word dw' having a value of "000011111". In some cases, the first length modification element 314a may truncate the shifted digital word dw' by x=4 places to generate a shifted digital word dw' having a value of "11111", which provides the digital loop filter 306 with a lower resolution. The digital loop filter 306 filters the shifted digital word dw' to generate a control word cw having a value of "11001". The second bit shifting element 308 is operated to shift the bit values in the digital word to the left by x=4 places to generate a shifted control word cw' having a value of "110010000", which is provided to DCO 310.

In other cases the digital loop filter 306 comprises a low resolution that is optimized for DPLL 300 operating in a settling state. In such a case, the first bit shifting element 304 is configured to selectively increase the resolution of the digital loop filter 306 when operating in a locked state. Therefore, during the settling state, the first bit shifting element 304 is inactive and does not operate upon the digital word dw. However, during the locked state, the first bit shifting element 304 is activated to operate upon the first digital word dw to increase the resolution of the digital loop filter 306.

Figures 3C, 4:
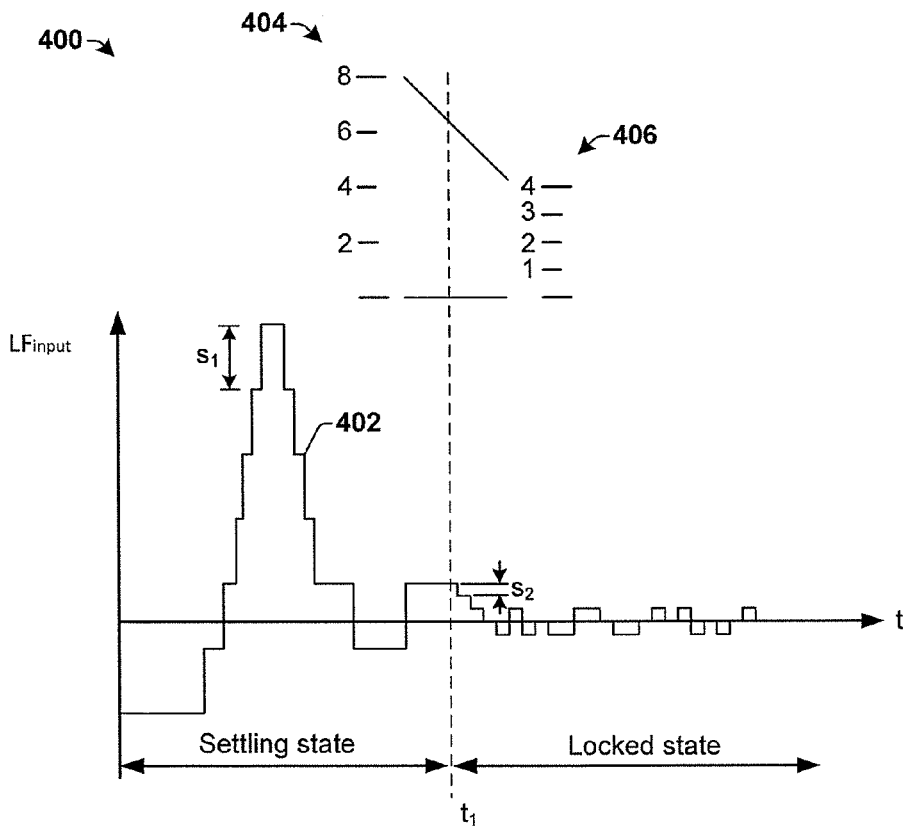

For example, FIG. 3C is a table 320 showing operation of DPLL 300 having a digital loop filter 306 with a low resolution. As shown in table 320, during the settling state the first bit shifting element 304 receives a first digital word dw="000011111". The first bit shifting element 304 is operated to shift bit values in the digital word to the left by x=4 places to generate a shifted digital word dw' having a value of "111110000", which provides the digital loop filter 306 with a higher resolution. The digital loop filter 306 filters the shifted digital word dw' to generate a control word cw having a value of "110010000". The second bit shifting element 308 is operated to shift the bit values in the digital word to the right by x=4 places to generate shifted control word cw' having a value of "11001". In some cases, the second length modification element 314b may elongate the shifted control word cw' by x=4 places to generate a shifted control word cw' having a value of "000011001".

FIG. 4 shows a graph 400 illustrating the effect of resolution changes on a digital word 402 input to a digital loop filter. The input to a digital loop filter of a PLL is shown on the y-axis and time is shown on the x-axis.

While in the settling state, the digital loop filter receives a digital word having a first value. The first value of the digital word causes the digital loop filter to operate at a first resolution 404 that provides for a first step size of $S_1$. At time $t_1$, the PLL transitions between the settling state and a locked state. Upon entering the locked state, bits in the digital word are shifted to cause the digital word to have a second value. The second value of the digital word causes the digital loop filter to operate at a second resolution 406 that provides for a second step size of $S_2<S_1$.

By reducing a value of the digital word, a frequency range associated with each integer value of the digital word is increased, causing the resolution of the digital loop filter to be reduced (i.e., each integer of a digital word corresponds to a larger frequency range). For example, representing a phase difference of 100 MHz with a digital word having a value of 10 would provide for a lower resolution (e.g., 10 MHz/integer) than representing the phase difference of 100 MHz with 100 digits (e.g., 1 MHz/integer). Alternatively, by increasing a value of the digital word, a frequency range associated with each integer value of the digital word is decreased, causing the resolution to be increased (i.e., each integer of a digital word corresponds to a smaller frequency range).

Figure 5:
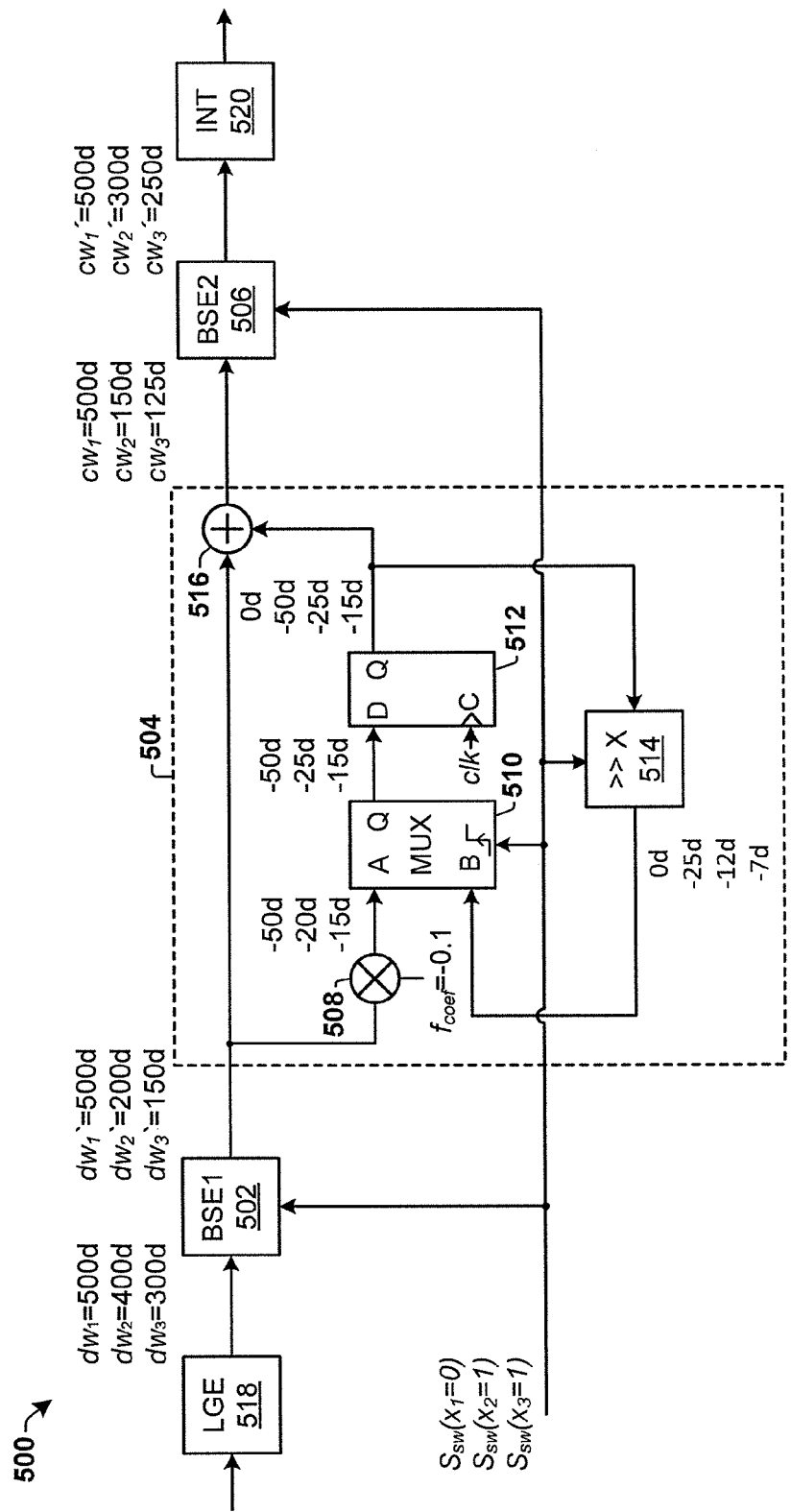
FIG. 5 illustrates a more detailed example of a bit shifting network and a digital loop filter for a disclosed digital phase locked loop.

FIG. 5 illustrates a more detailed example of digital loop filter 500 comprising bit shifting elements 502 and 504 configured to implement a resolution change.

As shown in FIG. 5, the digital loop filter 500 comprises a loop gain element 518 configured to set a bandwidth of the DPLL to achieve a stable loop design, bit shifting elements 502 and 506, a lead filter 504, and an integrator 520. It will be appreciated that the digital loop filter 500 may further comprise additional elements (e.g., a low-pass filter configured to fulfill spectral requirements of different communication standards).

Bit shifting elements 502 and 506 are configured to exchange digital words with the lead filter 504, which comprises a finite impulse response (FIR) filter. As shown in FIG. 5, the first bit shifting element 502 may be located downstream of the loop gain element 518 and the second bit shifting element 506 may be located upstream of the integrator 520, such that the loop gain element 518 and the integrator 520 operate without the resolution change introduced by bit shift elements 502 and 506. The FIR filter comprises a multiplier 508 configured to implement a filter coefficient $f_{coef}$ on a received digital word dw'. The filter coefficient $f_{coef}$ is configured to raise the phase in the open loop transfer function to achieve a stable loop.

The state of the FIR filter is switched via a multiplexer 510, based upon a value of a switching signal $S_{sw}$. The multiplexer 510 comprises a first input A and a second input B. The first input A is connected to an output of a multiplier 508, while the second input B is connected to an additional bit shifting element 514.

An output Q of the multiplexer 510 is provided to a D input of a flip-flop 512, which is configured to generate a filtered component that is subtracted from the shifted digital word dw' at summation node 516. The flip-flop 512 is configured to capture the value of the D input at a rising edge of a clock signal c/k provided to input C. The captured value is output at output Q of the flip-flop 512. Since the signal on the D input is captured the moment the flip-flop 512 is clocked, subsequent changes on the D input are ignored until the next clock edge, so that the flip-flop 512 stores a wrong value. Therefore, the additional bit shifting element 514 is configured to shift the value of the stored state so that the input B of the multiplexer 510 receives a bit shifted state. The additional bit shifting element 514 is controlled by the same switching signal $S_{sw}$ that controls the first and second bit shifting elements, 502 and 506.

For example, at a first time $t_1$, the DPLL is operating in a settling state and a switching signal $S_{sw}(x_1=0)$, having a value "0", is provided to the first and second bit shifting elements, 502 and 506. The first bit shifting element 502 receives a digital word $dw_1$ having a value of "111110100" (e.g., having a decimal value of 500). Since the switching signal $S_{sw}(x_1=0)$ is set to "0", the first bit shifting element 502 does not shift bits within the digital word dm, but rather outputs a digital word $dw_1'$ having a value of "111110100" (e.g., having a decimal value of 500) to the lead filter 504.

The multiplier 508 receives the digital word $dw_1'$. The filtering coefficients $f_{coef}$ cause the multiplier 508 to output a value of −50 d to input A of multiplexer 510. Since the switching signal $S_{sw}(x_1=0)$ is set to "0", the multiplexer 510 provides the output of the multiplier 508 (−50 d) to the D input of flip-flop 512. Since the flip-flop 512 is off by a clock cycle, rather than outputting −50 d, it outputs a value of 0 d, so that the lead filter 504 generates a control word $cw_1$ with a value of 500 d. Since the switching signal $S_{sw}(x_1=0)$ is set to "0", the second bit shifting element 506 does not shift bits within the control word $cw_1$, so that shifted control word $cw_1'$ has a value of 500 d.

At a second time $t_2$, the DPLL is operating in a locked state and a switching signal $S_{sw}(x_2=1)$ having a value of "1" is provided to the first and second bit shifting elements, 502 and 506. The first bit shifting element 502 receives a digital word $dw_2$ having a value of "110010000" (e.g., having a decimal value of 400). Since the switching signal $S_{sw}(x_2=4)$ is set to "1", the first bit shifting element 502 shifts bits within the digital word $dw_2$ by 1 bit, outputting a digital word $dw_2'$ having a value of "1100100" (e.g., having a decimal value of 200).

The filtering coefficients $f_{coef}$ cause the multiplier 508 to output a value of −20 d to input A of the multiplexer 510.

Since the switching signal $S_{sw}(x_2=1)$ is set to "1", the multiplexer 510 provides the output of the additional bit shifting element 514 to the D input of flip-flop 512. Since the flip-flop 512 is off by a clock cycle, it outputs a value of −50 d (from time $t_1$), so that the lead filter 504 generates a control word $cw_2$ with a value of 150 d. Since the switching signal $S_{sw}$ ($x_2=1$) is set to "1", the second bit shifting element 506 shifts bits within the control word $cw_2$ by 1 bit, outputting a control word $cw_2'$ having a value of "1100100" (e.g., having a decimal value of 300).

At a third time $t_3$, the DPLL is operating in a locked state and a switching signal $S_{sw}(x_3=1)$ having a value of "1" is provided to the first and second bit shifting elements, 502 and 506. The first bit shifting element 502 receives a digital word $dw_3$ having a value of "100101100" (e.g., having a decimal value of 300). Since the switching signal $S_{sw}(x_3=1)$ is set to "1", the first bit shifting element 502 shifts bits within the digital word $dw_3$ by 1 bit, outputting a digital word $dw_3''$ having a value of "010010110" (e.g., having a decimal value of 200).

The filtering coefficients $k_{coef}$ cause the multiplier 508 to output a value of −15 d to input A of the multiplexer 510. Since the switching signal $S_{sw}(x_3=1)$ is set to "1", the multiplexer 510 provides the output of the additional bit shifting element 514 to the D input of flip-flop 512. Since the flip-flop 512 is off by a clock cycle it outputs a value of −25 d (from time $t_2$), so that the lead filter 504 generates a control word $cw_3$ with a value of 125 d. Since the switching signal $S_{sw}$ ($x_3=4$) is set to "1", the second bit shifting element 506 shifts bits within the control word $cw_3$ by 1 bit, outputting a control word $cw_3'$ having a value of "1100100" (e.g., having a decimal value of 250).

Figure 6:
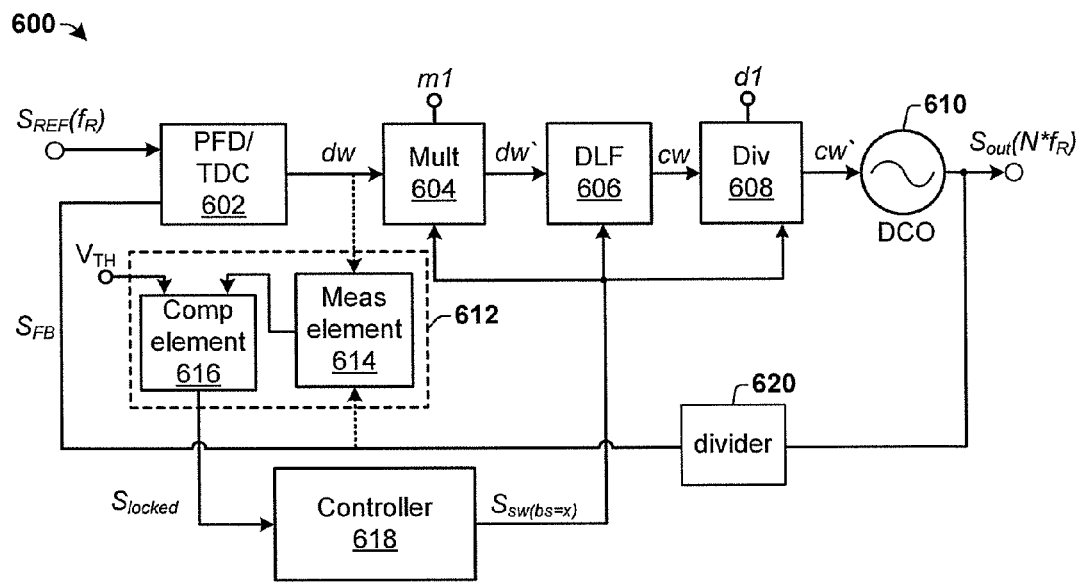
FIG. 6 illustrates an alternative example of a disclosed digital phase locked loop.

FIG. 6 illustrates an alternative example of a disclosed digital phase locked loop (DPLL) 600.

As shown in DPLL 600, a first bit shifting element comprising a multiplication unit 604 located upstream of a digital loop filter 606 and a second bit shifting element comprising a division unit 608 is located downstream of the digital loop filter 606. The multiplication unit 604 is configured to multiply a digital word dw output from a PFD 602 by a multiplication factor m1 that shifts the bits of the digital word dw in a first direction. For example, the multiplication unit 604 may multiply a dw="1010" by a multiplication factor m1="10" to get a digital word dw'="10100". The division unit 608 is configured to divide a control word cw output from the digital loop filter 606 by a division factor d1 that shifts the bits of the control word cw in a second direction, which is opposite the first direction. For example, the division unit 608 may divide a control word cw="10100" by a division factor d1="10" to get a control word cw'="1010" that is provided to DCO 610.

It will be appreciated that the location of the multiplication unit 604 and the division unit 608 may be chosen based upon a resolution of the digital loop filter 606. For example, to increase the resolution of the digital loop filter 606, the multiplication unit 604 is located upstream of the digital loop filter 606 and the division unit 608 is located downstream of the digital loop filter 606, as described above. Alternatively, to decrease the resolution of the digital loop filter 606, the division unit 608 is located upstream of the digital loop filter 606 and the multiplication unit 604 is located downstream of the digital loop filter 606.

In some cases, the DPLL 600 may further comprise a lock detector block 612 configured to detect when the DPLL 600 has reached the locked state. The lock detector block 612 is configured to provide a signal $S_{locked}$ to a controller 618, which causes the controller 618 to output a switching signal $S_{sw}$ that controls operation of the first and second bit shifting elements.

In some cases, the lock detect block 612 may comprise a measurement element 614 and a comparison element 616. The measurement element 614 is configured to measure the phase difference between the reference signal $S_{REF}$ and the feedback signal $S_{FB}$, and to provide the phase difference to the comparison element 616. The comparison element 616 is configured to compare the phase difference to a predetermined threshold value $V_{TH}$. If the phase difference violates the predetermined threshold value $V_{TH}$, the comparison element 616 outputs a signal $S_{locked}$ to the controller 618, causing the controller 618 to change a value of the switching signal $S_{sw}$. For example, in some cases the controller 618 is configured to switch from a settling state to a locked state if the phase difference falls below a predetermined threshold value $V_{TH}$. In various examples, the measurement element 614 may measure the phase difference before or after the digital loop filter 606 or from the feedback loop. In some examples, the measurement element 614 may comprise the PFD 602.

In some cases, the DPLL 600 may further comprise a divider 620 located within the feedback path. In some embodiments, the divider 620 may comprise a multi modulus divider in combination with a MASH modulator. The divider 620 is configured to divide the output signal $S_{out}$ output from DCO 610. One of ordinary skill in the art will appreciated that by dividing the output signal $S_{out}$ output from DCO 610 the frequency of the output signal ($N*f_R$) can be varied to be a multiple of the frequency of the reference signal $f_R$.

Figure 7:
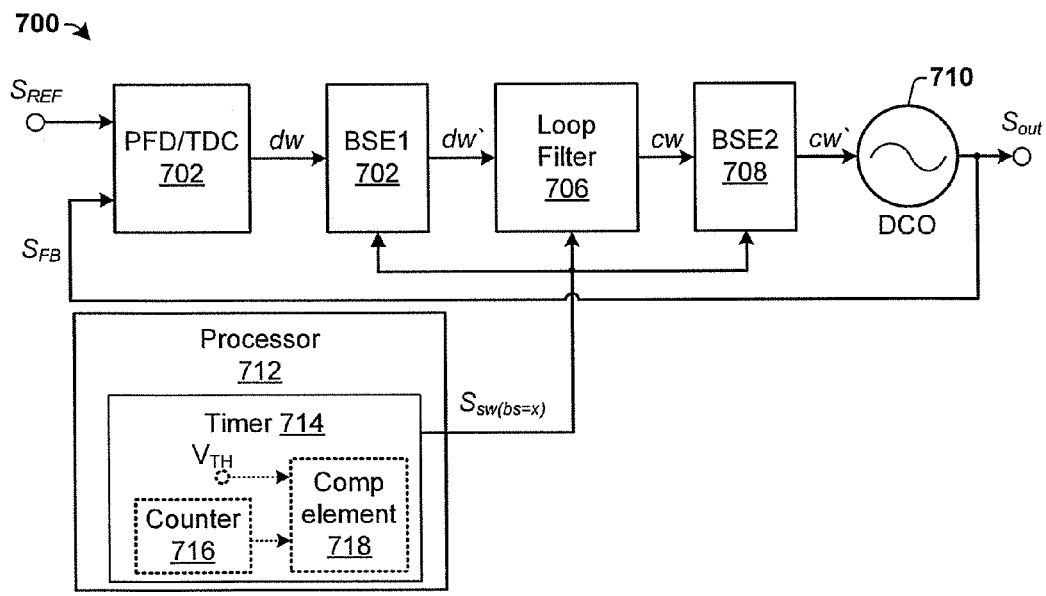
FIG. 7 illustrates an alternative example of a disclosed digital phase locked loop.

In FIG. 7 illustrates an alternative example of a disclosed digital phase locked loop (DPLL) 700.

DPLL 700 comprises a controller comprising a processor 712 having a timer 714 configured to control a value of a switching signal $S_{sw}$ that is provided to a first and second bit shifting elements, 702 and 706, and the digital loop filter, 704. The timer 714 is configured to set the switching signal $S_{sw}$ to a first value, corresponding to a first resolution, for a predetermined amount of time that is substantially equal to a time that the DPLL 700 takes to settle. After the predetermined amount of time has elapsed, the timer 714 is configured to change the value of the switching signal $S_{sw}$ to a second value corresponding to a second resolution that is higher than the first resolution.

In some examples, the timer 714 comprises a counter 716 and a comparison element 718. The counter 716 is configured to increment its value and to provide its value to a comparison element 718 that is configured to compare the value to a predetermined threshold value $V_{TH}$. If the value violates the predetermined threshold value $V_{TH}$, a certain number of clock cycles have been passed through the counter 716, and processor 712 changes a state of the switching signal $S_{sw}$.

Figure 8:
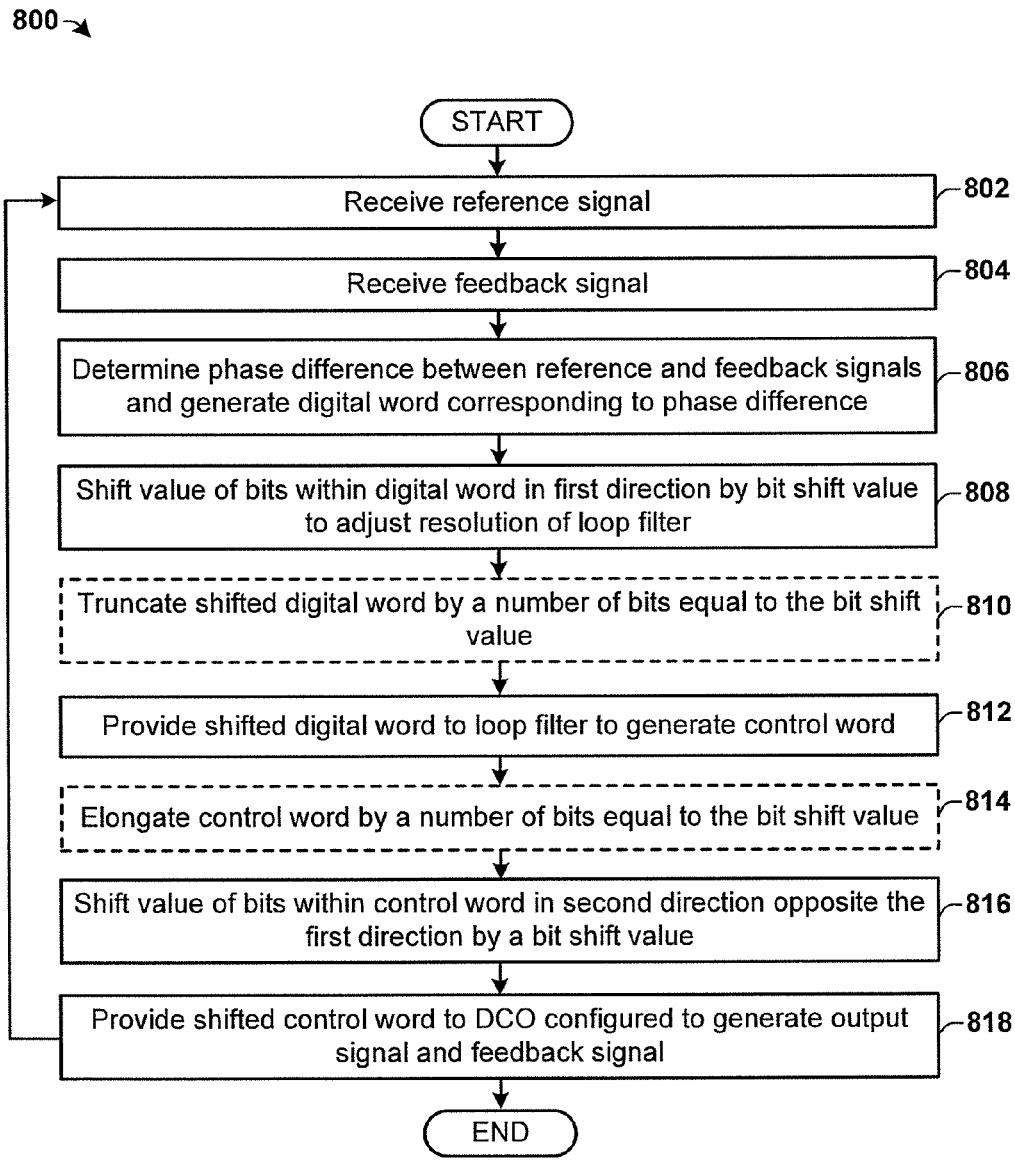
FIG. 8 is a flow diagram of an exemplary method to vary the resolution of a digital loop filter within a digital phase locked loop.

FIG. 8 is a flow diagram of an exemplary method 800 to vary the resolution of a digital loop filter within a digital phase locked loop.

While the disclosed method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of the description herein. Further, one or more of the acts depicted herein may be carried out in one or more separate acts and/or phases.

At 802, a reference signal is received. The reference signal comprises a first phase $\phi_1$.

At 804, a feedback signal is received. The feedback signal comprises a second phase $\phi_2$.

At 806, a phase difference between the reference signal and feedback signal is determined and a digital word is generated. The digital word is proportional to the phase difference $|\phi_1, \phi_2|$.

At 808, bits of the digital word are selectively shifted in a first direction by a bit shift value. Shifting the bits of the digital word in a first direction adjusts (e.g., increases, decreases) the resolution of a digital loop filter.

At 810, the shifted digital word may be truncated to reduce the number of bits in the digital word by a number that is equal to the bit shift value.

At 812, the shifted digital word is provided to a digital loop filter. The digital loop filter, filters the shifted digital word to generate a control word.

At 814, the control word may be elongated to increase the number of bits in the control word by a number that is equal to the bit shift value.

At 816, bits of the control word are selectively shifted in a second direction opposite the first direction by the bit shift value.

At 818, the shifted control word is provided to a digitally controlled oscillator to generate an output signal and a feedback signal. Method 800 may be performed iteratively, wherein a phase difference is determined (at 806) between a reference signal and the feedback signal generated at 814. By iteratively performing method 800, the method may transition from a settling state, in which the method is attempting to lock a phase of the feedback signal to a phase of the input signal, to a locked state, in which the method is attempting to keep a phase of the feedback signal equal to a phase of the input signal.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure-which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A digital phase locked loop (DPLL), comprising:
a phase frequency detector configured to determine a phase difference between a reference signal and a feedback signal and to convert the phase difference to a digital word;
a digital loop filter configured to filter the digital word to generate a control word;
a bit shift network configured to modify the digital word in a manner that switches a resolution of the digital loop filter between two or more distinct resolution states that comprise a bit sequence located at different positions in the digital word; and
a digitally controlled oscillator (DCO) to receive the control word and to vary the phase of the feedback signal based upon the control word.

2. The DPLL of claim 1, wherein the bit shift network comprises:
a first bit shifting element located upstream of the digital loop filter and configured to selectively shift a position of bits within the digital word in a first direction by a bit shift value; and
a second bit shifting element located downstream of the digital loop filter and configured to selectively shift the position of bits within the digital word in a second direction, opposite the first direction, by the bit shift value.

3. The DPLL of claim 2,
wherein the first bit shifting element is configured to selectively reduce a resolution of the digital loop filter from a first resolution to a second resolution by shifting the position of bits within the digital word in the first direction.

4. The DPLL of claim 3, further comprising:
a truncation element configured to truncate the shifted digital word to reduce a number of bits in the shifted digital word by a number that is equal to the bit shift value.

5. The DPLL of claim 2, further comprising:
wherein the first bit shifting element is configured to selectively increase a resolution of the digital loop filter from a first resolution to a second resolution by shifting the position of bits within the digital word in the first direction.

6. The DPLL of claim 2, further comprising:
a controller configured to generate a switching signal that selectively switches the resolution of the digital loop filter when the digital phase locked loop transitions from a settling state to a settled state.

7. The DPLL of claim 6, further comprising:
a measurement element configured to measure the phase difference between the reference signal and the feedback signal; and
a comparison element configured to compare the measured phase difference to a predetermined threshold value;
wherein the comparison element is configured to generate a control signal that causes the controller to switch the resolution of the digital loop filter when the phase difference violates the predetermined threshold value.

8. The DPLL of claim 6, further comprising:
a counter configured to increment a counter value; and
a comparison element configured to compare the counter value to a predetermined threshold value;
wherein the comparison element is configured to generate a control signal that causes the controller to switch the resolution of the digital loop filter when the counter value violates the predetermined threshold value.

9. The DPLL of claim 6,
a delay element connected between the controller and the second bit shifting element and configured to introduce a delay into the switching signal that accounts for a delay of the digital loop filter.

10. The DPLL of claim 2,
wherein the first bit shifting element comprises a multiplication unit configured to multiply the digital word by a multiplication factor that shifts the position of the bits within the digital word in the first direction; and
wherein the second bit shifting element comprises a division unit configured to divide the digital word by a division factor that shifts the position of the bits within the digital word in the second direction.

11. The DPLL of claim 1, wherein the digital loop filter comprises:
a lead filter having a multiplexer connected in series with a D-flip flop, wherein the multiplexer comprises a first input connected to the output of the first bit shifting element, and a second input connected to an additional bit shifting element connected to an output of the D-flip flop.

12. A digital phase locked loop (DPLL), comprising:
a phase frequency detector configured to determine a phase difference between a reference signal and a feedback signal and to convert the phase difference to a digital word;
a first bit shifting element configured to selectively shift a position of bits within the digital word in a first direction by a bit shift value;
a digital loop filter configured to filter the digital word that is output from the first bit shifting element to generate a control word;
a second bit shifting element configured to selectively shift the position of bits within the control word in a second direction, opposite the first direction, by a bit shift value;
a digitally controlled oscillator (DCO) to the phase of the feedback signal based upon the control word that is output from the second bit shifting element; and
a controller configured to generate a switching signal that selectively switches a resolution of the digital loop filter when the DPLL transitions from a settling state to a locked state.

13. The DPLL of claim 12,
wherein the first bit shifting element is configured to selectively reduce a resolution of the digital loop filter from a first resolution to a second resolution by shifting the position of bits within the digital word in the first direction.

14. The DPLL of claim 12,
wherein the first bit shifting element is configured to selectively increase a resolution of the digital loop filter from a first resolution to a second resolution by shifting the position of bits within the digital word in the first direction.

15. The DPLL of claim 12,
a measurement element configured to measure the phase difference between the reference signal and the feedback signal; and
a comparison element configured to compare the measured phase difference to a predetermined threshold value;
wherein the comparison element is configured to generate a control signal that causes the controller to switch the resolution of the digital loop filter when the phase difference violates the predetermined threshold value.

16. The DPLL of claim 12,
a counter configured to increment a counter value; and
a comparison element configured to compare the counter value to a predetermined threshold value;
wherein the comparison element is configured to generate a control signal that causes the controller to switch the resolution of the digital loop filter when the counter value violates the predetermined threshold value.

17. A method, comprising:
receiving a reference signal;
receiving a feedback signal;
determining a phase difference between the reference signal and the feedback signal and generating a digital word that is proportional to the phase difference;
selectively shifting a position of bits within the digital word in a first direction by a bit shift value to generate a shifted digital word;
providing the shifted digital word to a digital loop filter to generate control word; and
selectively shifting the position of bits within the control word in a second direction by the bit shift value opposite the first direction to generate a shifted control word.

18. The method of claim 17,
wherein selectively shifting the position of bits within the digital word in the first direction reduces a resolution of the digital loop filter from a first resolution to a second resolution.

19. The method of claim 17,
wherein selectively shifting the position of bits within the digital word in the first direction increases a resolution of the digital loop filter from a first resolution to a second resolution.

20. The method of claim 17, further comprising:
truncating the shifted digital word to reduce a number of bits in the shifted digital word by a number that is equal to the bit shift value.

* * * * *